United States Patent
Hazelzet et al.

(10) Patent No.: US 6,446,163 B1
(45) Date of Patent: Sep. 3, 2002

(54) MEMORY CARD WITH SIGNAL PROCESSING ELEMENT

(75) Inventors: Bruce G. Hazelzet, Essex Junction; Christopher P. Miller, Underhill; Clarence R. Ogilvie, Huntington; Paul C. Stabler, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/386,543

(22) Filed: Aug. 31, 1999

Related U.S. Application Data

(63) Continuation-in-part of application No. 09/225,524, filed on Jan. 4, 1999, now Pat. No. 6,233,639.

(51) Int. Cl.⁷ .......................... G06F 12/06; G06F 13/00
(52) U.S. Cl. ............................ 711/115; 711/5; 711/104; 710/129
(58) Field of Search .................. 711/5, 104, 115; 710/129; 712/32

(56) References Cited

U.S. PATENT DOCUMENTS

| | | | | |
|---|---|---|---|---|
| 5,522,085 A | * | 5/1996 | Harrison et al. | 712/32 |
| 6,173,363 B1 | * | 1/2001 | Tsuyuguchi | 711/115 |
| 6,233,639 B1 | * | 5/2001 | Dell et al. | 710/129 |

* cited by examiner

Primary Examiner—Matthew Kim
Assistant Examiner—B. R. Peugh
(74) Attorney, Agent, or Firm—William N. Hogg

(57) ABSTRACT

A memory card having a memory bus controller is provided which card has a signal processing element preferably a digital signal processor (DSP) thereon, which card is used in a computer system as add-on memory. Also, a method of using such a card in a computer system is provided. The memory bus controller and the signal processing element are programmed to pass all the addresses in the memory on the card and the associated data received from the CPU to the signal processing element where they are stored in memory. The signal processing element is programmed to perform selected operations on the addresses and/data irrespective of whether the signal processing element has control of the system bus. These operations can include keeping track of read/write operations and the locations of these operations. This information can be easily accessed by the computer system and used for memory optimization.

The DSP can also "snoop" the memory bus when it is unavailable to the control of the DSP, i.e. when the system has control of the memory bus. The memory bus controller passes addresses and data to the DSP as it is received. When the DSP receives addresses that are in its normal or regular range, or other selected ranges, for processing in the memory. The DSP can capture the data and do "early" processing or pre-processing of this information before the DSP gains control of the memory.

31 Claims, 2 Drawing Sheets

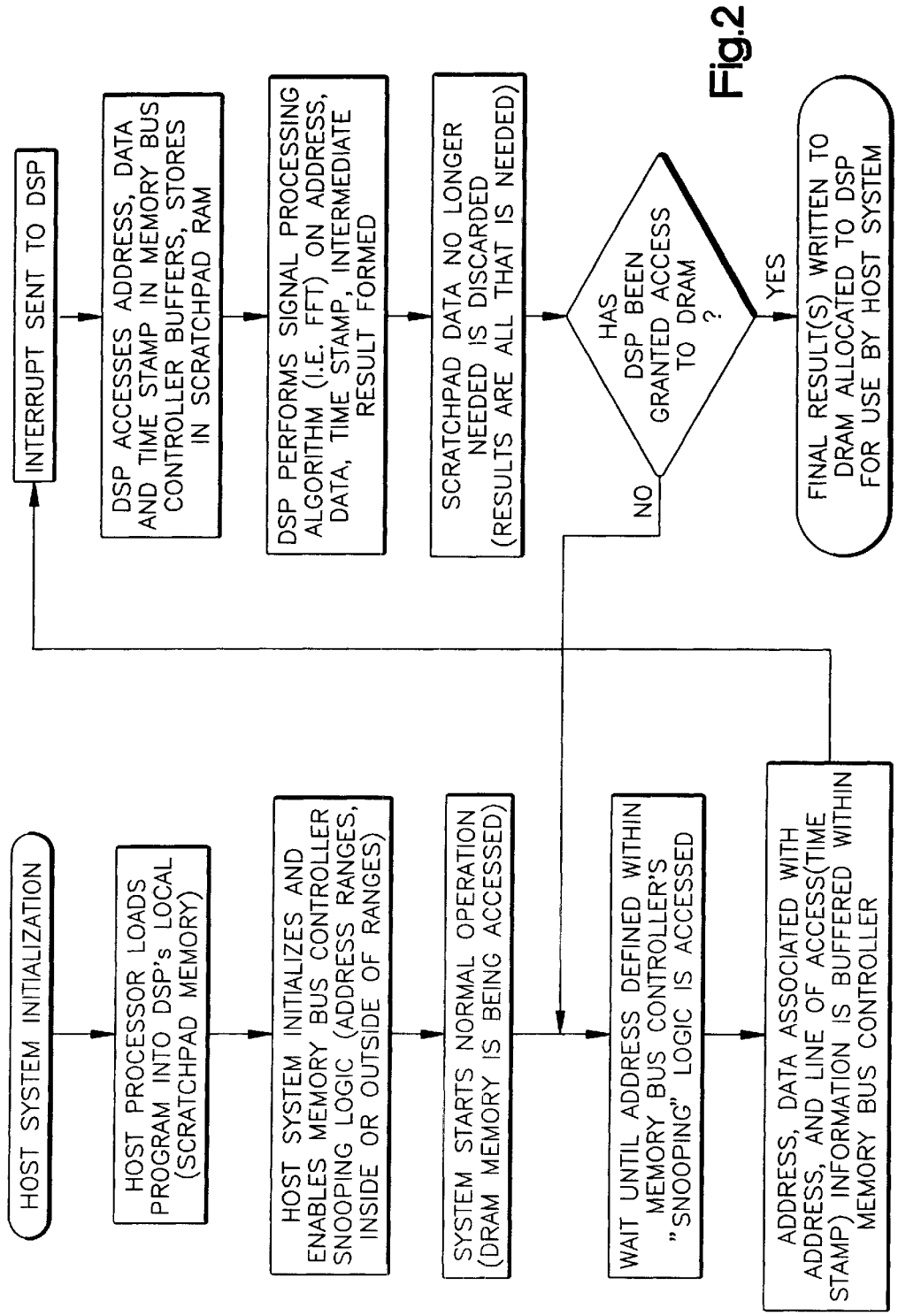

MEMORY CARD WITH SIGNAL PROCESSING ELEMENT

RELATED APPLICATION

This application is a continuation in part of application Ser. No. 09/225,524, filed Jan. 4, 1999, now U.S. Pat. No. 6,233,639 B1, issued May 15, 2001.

BACKGROUND OF THE INVENTION

1. Field of the Invention

This invention relates generally to memory cards with signal processing elements thereon; and more particularly to memory SIMMs or DIMMs having signal processing elements thereon to receive data from selected addresses and perform operations thereon when the memory bus is not available to the signal processing element.

2. Background Information

The use of signal processing elements, especially digital signal processing elements (DSPs), is being proposed as components on memory cards and boards for use in computers. The purpose is to allow the DSP to use some portion of the memory while that memory is not being utilized by the system. This provides significant cost savings by making a potentially large block of memory available to the DSP without adding a totally separate system memory bus and extra memory for the DSP. This results in more computing power at a lower cost. However, conventionally, the DSP has access to the memory only when the system does not have control of the memory bus for the idle capacity. This leaves the DSP unoccupied and, thus, under utilized for significant periods of time.

SUMMARY OF THE INVENTION

According to the present invention, a memory card having a memory bus controller is provided, which card has a signal processing element, preferably a digital signal processor (DSP) thereon. The card is used in a computer system as add-on memory. Also, a method of using such a card in a computer system is provided. The memory bus controller and the signal processing element are programmed to pass all the addresses in the memory on the card and the associated data received from the CPU to the signal processing element where they are stored in memory. The signal processing element is programmed to perform selected operations on the addresses and data irrespective of whether the signal processing element has control of the system bus. These operations can include keeping track of read/write operations and the locations of these operations. This information can be easily accessed by the computer system and used for memory optimization.

The DSP can also "snoop" the memory bus when it is unavailable to the control of the DSP, i.e. when the system has control of the memory bus. The memory bus controller passes addresses and data to the DSP as it is received, when the DSP receives addresses that are in its normal or regular range, or other selected ranges, for processing in the memory. The DSP can capture the data and do "early" processing or preprocessing of this information before the DSP gains control of the memory.

DESCRIPTION OF THE DRAWINGS

FIG. 2 is a flow chart of the "snooping" logic for the DSP according to the present invention.

DESCRIPTION OF THE PREFERRED EMBODIMENT(S)

Figure 1:
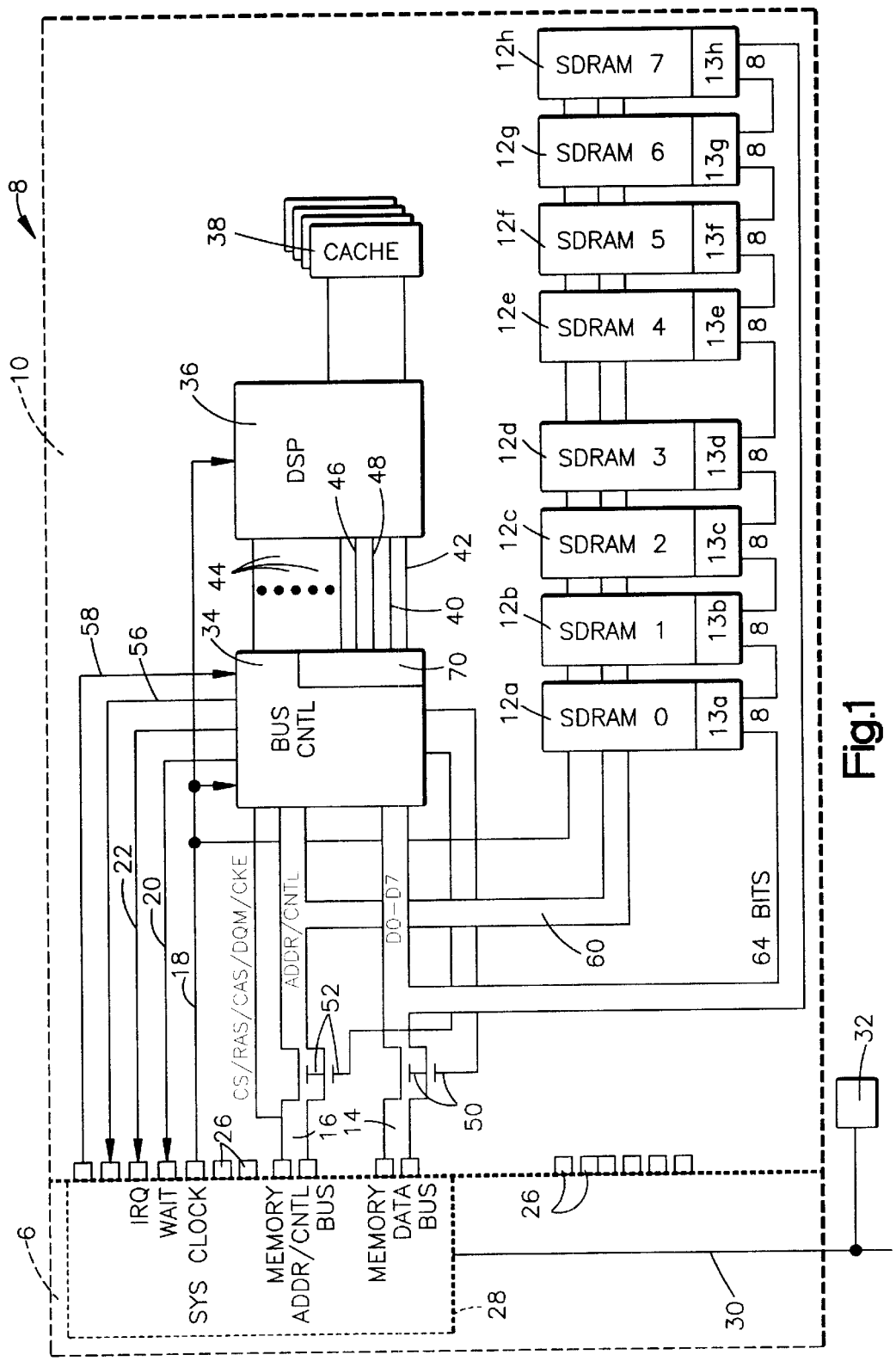
FIG. 1 is a high level diagram of a DIMM with a Digital Signal Processor (DSP) mounted thereon according to this invention.

Referring now to the drawings and, for the present, to FIG. 1, one embodiment of the present invention is shown as embodied in a personal computer 6 which has a CPU. A memory module 8, such as a DIMM or SIMM, is provided which includes a printed circuit card 10 having a plurality of memory chips in the form of synchronous DRAMs (SDRAMs) 12a through 12h. (It is to be understood that the number of the SDRAMs could be more or less, and that they can be arranged in one or more banks, as is well known in the art.) The synchronous DRAMs 12a–12h, which are conventional SDRAMs, are configured and arranged to store both data bits and check bits written to them by the computer system 6. The SDRAMs 12a–12h each have memory location 13a–13h reserved for a signal processing element which will be described presently The circuit card 10 has a memory bus which includes a memory data bus 14 and a memory address/control bus 16; a system clock line 18, a wait line 20 and an interrupt request line 22 are also present. Memory data bus 14, memory address/control bus 16, system clock 8, wait line 20 and interrupt request line 22 are all connected to I/O connectors, sometimes referred to as pins 26. The I/O connectors 26 provide an interface to a system memory controller 28, which is a part of the CPU or computer 6. The system memory controller 28 also controls a PCI bus 30 (and optionally other buses not shown). The PCI bus 30 has thereon devices such as a codec 32.

The memory card 10 also has a memory bus controller 34 which is connected to the memory data bus 14, the memory address/control bus 16, the system clock 18, the wait line 20, and the interrupt request line 22. The bus controller 34 is connected to a signal processing element 36 which, in the preferred embodiment, is a digital signal processor (DSP). A particularly useful DSP is any one of the TMS 320C54X family manufactured by Texas Instruments, Inc. This particular DSP family includes an external cache or scratch pad memory 38. The memory bus controller 34 and DSP 36 are interconnected by a chip address bus 40, a chip data bus 42 and control lines 44 that pass various control signals, addresses and data between the memory bus controller 34 and the DSP 36. Also, an interrupt bus 46 and an indicator bus 48 connect the bus controller 34 to the DSP 36.

The memory data bus 14 has FET switches 50 therein. (It is to be understood that the memory data bus 14 is comprised of multiple lines, one for each bit, and there is an FET 50 for each bit line.) The memory data bus 14 may be an 8 bit bus, a 16 bit bus, a 32 bit bus, or a 64 bit bus, and indeed any size data bus which includes whatever number of data lines are required. Also, there are FET switches 52 in the system address/control bus 16. The system clock line 18 is also connected to the DSP 36 in the preferred embodiment; however, it is to be understood that a separate clock could be provided for the DSP if different timing is used on the card from the timing used in the CPU. However, the preferred embodiment for most instances is to use the system clock for clocking the functions and signals on the memory module.

A two wire serial bus, comprised of wires 56, 58, is provided connecting the bus controller 34 to two contacts 26, which contacts 26 communicate with the system memory controller 28.

In the illustrated and described embodiment, the memory is an add-on memory module. However, the invention can be incorporated in any memory sub-system, whether or not it is a "pluggable" add-on memory.

Many tasks of the DSP are accomplished when the memory module is not being addressed for either a read or write function or other function by the CPU through the memory controller 28. Thus, the FETs 50 and 52 are in an open position when these tasks are taking place. If, however, when the CPU wishes to access the memory module, the FETs are closed and the memory controller 28 can address the memory module 8 on the memory data bus 14 and memory address/control bus 60 to perform conventional read/write operations from and to the SDRAMs 12a–12h, According to the present invention, the DSP 36 performs several functions. One of these functions is to receive from the memory bus controller 34 all addresses and associated data written to and read from the DRAMs 12a–12h from and to the system under the control of the memory bus controller 34, whether or not the addresses are within the DSPs ranges 13a–13h. A program is loaded into the DSPs cache memory 38 which will time stamp the activity and keep track of e.g. the number of reads and writes and location where at least some of the data is stored. This information is stored and can be accessed by the computer system 6 through the memory bus controller 34, and the information utilized for memory optimization. These operations can include, for example, but are not limited to, time-domain analysis of the addresses/data, and spectral analysis (FFT or DCT) to determine hot spots in memory. The system 6 can use this data to optimize the distribution of data and maximize performance and minimize power requirements. This activity of the DSP 36 takes place during the time that the system, rather than the DSP, has control of the memory, thus increasing the utilization of the DSP 36.

Another function that the DSP 36 can perform is to "snoop" the system bus for writes to the addresses in sections 13a–13h of memory chips 12a–12h allocated to the DSP 36 (or other selected addresses if desired). If there is a write to an address in this range, the DSP 36 can capture the address and data and perform any required early processing operations even if the DSP 36 does not have access to the memory chips 12a–12h. The information from the CPU of the computer system 6 is stored in cache memory 38 as it is received, and then discarded when the preprocessed information is available and stored in the cache memory 38. Then when the DSP 36 gains access to the DRAMs 12a–12h, it will have pre-processed the information and can write the information in its processed form to the memory chip address in the assigned location 13a–13h. These early processing operations can include determining frequency of addresses by performing a Fast Fourier Transform (FFT). Data compression can also be performed as well as calculating the outputs of a Finite Impulse Response (FIR) Filter as samples from an analog-to-digital converter are being written into addresses in sections 13a–13h.

If necessary, for example, if the bus controller 34 operates at a speed faster than the DSP 36, the bus controller can be provided with a buffer 70 for data to be written to the DSP 36.

FIG. 2 is a flow chart depicting the operation of the program for "snooping" the system bus in order for the DSP 36 to perform early processing operations. After the host system's initialization, the host processor or CPU 6 loads the "snooping" program, which the DSP 36 is to execute, into the cache or scratch pad memory 38 if the snooping program is not already resident. (If desired, the snooping program can be made resident in the cache 38 of the DSP 36 to avoid having to load the program upon initialization of the CPU. However, it is preferred to have the program resident in the system 6 so that various programs may be employed, not just the ones permanently resident, into the cache memory 38.) The CPU of computer system 6 enables the memory bus controller snooping logic for the snooping logic in the DSP 36 to "snoop" selected address ranges, which ranges normally will be within the address range allocated to the DSP 36, but may also contain addresses outside this range. The computer 6 then starts normal operation, with the memory controller accessing the DRAM memory 12a–12h as required. The "snooping program" in the DSP 36 monitors the memory bus controller 34.

When an address within the "snooping" logic or program range of addresses is detected, the detected address and associated data and time of access is buffered in the buffer 70 (if one is present) and an interrupt is sent from the memory bus controller on the interrupt bus 46 to the DSP 36. (If the speed of the DSP 36 is at least as great as that of the memory bus controller 34, then a buffer may not be needed in the memory bus controller 34.) In such case, the address, associated data and time stamp are passed directly to the DSP 36. The DSP 36 then accesses the address and data and time stamp in the buffer 70 of the memory bus controller 34 and stores this in the cache memory 38.

The DSP 36 then performs whatever processing algorithm (e.g. FFT or FIT filter or data compression) for which it is programmed. The results of the processing are stored in the cache memory 38, and the received data which is no longer needed is discarded.

If the DSP 36 is not granted access to the memory bus, it continues to snoop the memory bus controller for addresses in the range programmed for it and receives and processes data where appropriate. When access is granted the DSP 36 to the DRAMs 12a–12h, the results of the pre-processing are written from the cache 38 to the directed addresses in the DRAMs 12a–12h.

Thus, with the "snooping" function, the DSP 36 can process information in any pre-programmed ranges of addresses, even when the DSP 36 does not have control of the memory bus.

We claim:

1. A memory module for a computer system having a CPU comprising:

a printed circuit card;

memory chips on said printed circuit card;

a memory bus on said printed circuit card;

a memory bus control element configured to communicate with said memory chips and said memory bus;

switches in said memory bus to selectively connect and disconnect said memory bus with said CPU;

a signal processing element on said printed circuit card configured to communicate with said memory bus control element and with said memory chips through said memory bus control element;

programming in said memory bus control element to pass selected addresses and associated data from the CPU to said signal processing element;

said signal processing element being programmed to operate on said received data; and said programming in said memory bus control element including programming to selectively connect and disconnect said signal processing element with said memory chips through said memory bus controller.

2. The invention as defined in claim 1 wherein said selected addresses include all the addresses of said memory chips on said printed circuit card.

3. The invention as defined in claim 2 wherein said programming in said signal processing element includes programming to perform spectral analysis to determine hot spots in said memory.

4. The invention as defined in claim 1 wherein sections of the memory chips are reserved for the signal processing element, and the selected addresses include said reserved addresses and are less than all of the addresses of the memory chips.

5. The invention as defined in claim 4 wherein said programming said signal processing element includes programming to perform at least one operation selected from the group of fast fourier transform, data compression and finite impulse response filter.

6. The invention as defined in claim 1 wherein said programming in said signal processing element includes programming to perform data processing functions when said signal processing element is disconnected from said memory chips.

7. The invention as defined in claim 6, wherein said programming in said signal processing element includes programming to write the data processed thereby to said memory chips when the signal processing element has access to said memory chips.

8. The invention as defined in claim 1 wherein said signal processing element includes cache memory for storing data received from said CPU.

9. The invention as defined in claim 1 wherein said memory bus control element includes programming to write selected programs from the CPU to said signal processing element.

10. The invention as defined in claim 1 wherein said signal processing element is a digital signal processor.

11. The invention as defined in claim 1, further characterized by a buffer in said memory bus controller for the temporary storage of data, address, and time information prior to retrieval by said signal processing element.

12. A computer system comprising a CPU, including a memory sub-system, said memory sub-system comprising:
   memory chips;
   a memory bus;
   a memory bus control element configured to communicate with said memory chips and said memory bus;
   switches in said memory bus to selectively connect and disconnect said memory bus with said CPU;
   a signal processing element configured to communicate with said memory bus control element and with said memory chips through said memory bus control element;
   programming in said memory bus control element to pass selected addresses and associated data from the CPU to said signal processing element;
   said signal processing element being programmed to operate on said received data; and
   said programming in said memory bus controller including programming to selectively connect and disconnect said signal processing element with said memory chips through said memory bus controller.

13. The invention as defined in claim 12, further characterized by a buffer in said memory bus controller for the temporary storage of data, address, and time information prior to retrieval by said signal processing element.

14. The invention as defined in claim 12 wherein said selected addresses include all the addresses of said memory chips on said memory card.

15. The invention as defined in claim 14 wherein said programming in said signal processing element includes programming perform spectral analysis to determine hot spots in said memory.

16. The invention as defined in claim 12 wherein sections of the memory chips are reserved for the signal processing element, and the selected addresses include said reserved addresses and are less than all of the addresses of the memory chips.

17. The invention as defined in claim 16 wherein said programming in said signal processing element includes programming to perform at least one operation selected from the group of fast fourier transform, data compression and finite impulse response filter.

18. The invention as defined in claim 12 wherein said programming in said signal processing element includes programming to perform data processing functions when said signal processing element is disconnected from said memory chips.

19. The invention as defined in claim 18 wherein said programming in said signal processing element includes programming to write the data processed thereby to said memory chips when the signal processing element has access to said memory chips.

20. The invention as defined in claim 12 wherein said signal processing element includes cache memory for storing data received from said CPU.

21. The invention as defined in claim 12 wherein said memory bus control element includes programing to write selected programs from the CPU to said signal processing element.

22. The invention as defined in claim 12 wherein said signal processing element is a digital signal processor.

23. A method of operating a memory sub-system connected to a CPU of a computer system, and wherein said memory sub-system has memory chips on a memory card, a memory bus selectively connectable to the CPU and controlled by a memory bus control element, and a signal processing element, connected to said memory bus control element, comprise the steps of:
   passing selected addresses and associated data from the CPU to said signal processing element, wherein the selected addresses include all addresses of said memory chips on said memory card;
   performing operations on said data passed from said CPU in said signal processing element; and
   selectively connecting said signal processing element with said memory chips or said CPU through said memory bus control element.

24. The invention as defined in claim 23 wherein sections of the memory chips are reserved for the signal processing element, and the selected addresses include said reserved addresses and are less than all of the addresses of the memory chips.

25. The invention as defined in claim 23 wherein said signal processing element performs spectral analysis to determine hot spots in said memory.

26. A method of operating a memory sub-system connected to a CPU of a computer system, and wherein said memory sub-system has memory chips, a memory bus selectively connectable to the CPU and controlled by a memory bus control element, and a signal processing element, connected to said memory bus control element, comprising the steps of:
   passing selected addresses and associated data from the CPU to said signal processing element;
   performing operations on said data passed from said CPU in said signal processing element; and
   selectively connecting said signal processing element with said memory chips or said CPU through said memory bus control element wherein said signal processing element performs data processing fictions when said signal processing element is disconnected from said memory chips.

27. The invention as defined in claim 26 wherein said processing element writes the data processed thereby to said memory chips when the signal processing element has access to said memory chips.

28. A method of operate a memory sub-system connected to a CPU of a computer system, and wherein said memory sub-system has memory chips, a memory bus selectively connectable to the CPU and controlled by a memory bus control element, and a signal processing element, connected to said memory bus control element, comprising the steps of:

passing selected addresses and associated data from the CPU to said signal processing element wherein said signal processing element includes cache memory for storing data received from said CPU;

performing operations on said data passed from said CPU in said signal processing element; and selectively connecting said signal processing element with said memory chips or said CPU through said memory bus control element.

29. A method of operating a memory sub-system connected to a CPU of a computer system, and wherein said memory sub-system has memory chips, a memory bus selectively connectable to the CPU and controlled by a memory bus control element, and a signal processing element, connected to said memory bus control element, comprising the steps of:

passing selected addresses and associated data from the CPU to said signal processing element wherein said signal processing element is a digital signal processor;

performing operations on said data passed from said CPU in said signal processing element; and selectively connecting said signal processing element with said memory chips or said CPU through said memory bus control element.

30. A method of operating a memory sub-system connected to a CPU of a computer system, and wherein said memory sub-system has memory chips, a memory bus selectively connectable to the CPU and controlled by a memory bus control element, and a signal processing element, connected to said memory bus control element, comprising the steps of:

passing selected address and associated data from the CPU to said signal processing element;

performing operations on said data passed from said CPU in said signal processing element; and selectively connecting said signal processing element with said memory chips or said CPU through said memory bus control element which has a buffer in said bus control element for the temporary storage of data, address, and time information prior to retrieval by said signal processing element.

31. The invention as defined in claim 30 wherein said signal processing element performs at least one operation selected from the group of fast fourier transform, data compression and finite impulse response filter.

\* \* \* \* \*